(12) United States Patent
Thiruvengadam et al.

(10) Patent No.: US 11,808,806 B2
(45) Date of Patent: Nov. 7, 2023

(54) ALLOCATION OF TEST RESOURCES TO PERFORM A TEST OF MEMORY COMPONENTS

(71) Applicant: Micron Technology, Inc., Boise, ID (US)

(72) Inventors: Aswin Thiruvengadam, Folsom, CA (US); Sivagnanam Parthasarathy, Carlsbad, CA (US); Frederick Jensen, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 17/398,645

(22) Filed: Aug. 10, 2021

(65) Prior Publication Data

US 2021/0373072 A1 Dec. 2, 2021

Related U.S. Application Data

(62) Division of application No. 16/209,393, filed on Dec. 4, 2018, now Pat. No. 11,131,705.

(51) Int. Cl.
*G01R 31/28* (2006.01)
*G01R 31/00* (2006.01)

(52) U.S. Cl.
CPC ....... *G01R 31/2874* (2013.01); *G01R 31/003* (2013.01); *G01R 31/287* (2013.01); *G01R 31/2862* (2013.01)

(58) Field of Classification Search
None
See application file for complete search history.

(56) References Cited

U.S. PATENT DOCUMENTS

| 5,504,670 | A | * | 4/1996 | Barth | ............... G01R 31/31908 |
|---|---|---|---|---|---|
| | | | | | 718/104 |
| 6,960,908 | B2 | | 11/2005 | Chung et al. | |
| 9,341,675 | B2 | | 5/2016 | Kilian | |
| 9,405,661 | B1 | | 8/2016 | Chirgwin et al. | |
| 9,658,949 | B2 | * | 5/2017 | Shin | ............... G06F 11/3692 |
| 10,910,081 | B2 | * | 2/2021 | Thiruvengadam | .... G06F 3/0688 |
| 11,043,269 | B2 | * | 6/2021 | Thiruvengadam | ..... G11C 29/06 |
| 11,493,550 | B2 | * | 11/2022 | Scobee | ............. G01R 31/2862 |

(Continued)

FOREIGN PATENT DOCUMENTS

JP 2014236082 A 12/2014

OTHER PUBLICATIONS

PCT International Search Report and Written Opinion for International Application No. PCT/US2019/064436, dated Mar. 26, 2020 12 pages.

*Primary Examiner* — Jermele M Hollington
(74) *Attorney, Agent, or Firm* — Lowenstein Sandler LLP

(57) ABSTRACT

A system includes a memory component and a processing device, operatively coupled with the memory component, to receive a request to perform a first test of memory components at a test platform, identify test resources of the test platform that are associated with the memory components, identify, among the test resources, a subset of test resources that are not being used by a second test of the memory components at the test platform, and assign, based on the subset of the test resources, a test resource of the test resources to obtain an assigned test resource for use by the test.

20 Claims, 6 Drawing Sheets

(56) References Cited

U.S. PATENT DOCUMENTS

| | | | |
|---|---|---|---|
| 11,670,396 B2 * | 6/2023 | Khayat | ............... G11C 16/10 |
| | | | 714/721 |
| 2006/0002161 A1 | 1/2006 | Dangelo et al. | |
| 2013/0006567 A1 | 1/2013 | Horn | |
| 2013/0181734 A1 | 7/2013 | Horino et al. | |
| 2015/0234737 A1 | 8/2015 | Shin et al. | |

* cited by examiner

ALLOCATION OF TEST RESOURCES TO PERFORM A TEST OF MEMORY COMPONENTS

RELATED APPLICATION

The present Application is a Division of U.S. patent application Ser. No. 16/209,393, filed on Dec. 4, 2018, now U.S. Pat. No. 11,131,705, which is incorporated herein by reference in its entirety for all purposes.

TECHNICAL FIELD

The present disclosure generally relates to a memory sub-system, and more specifically, relates to the allocation of test resources to perform a test of memory components for memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
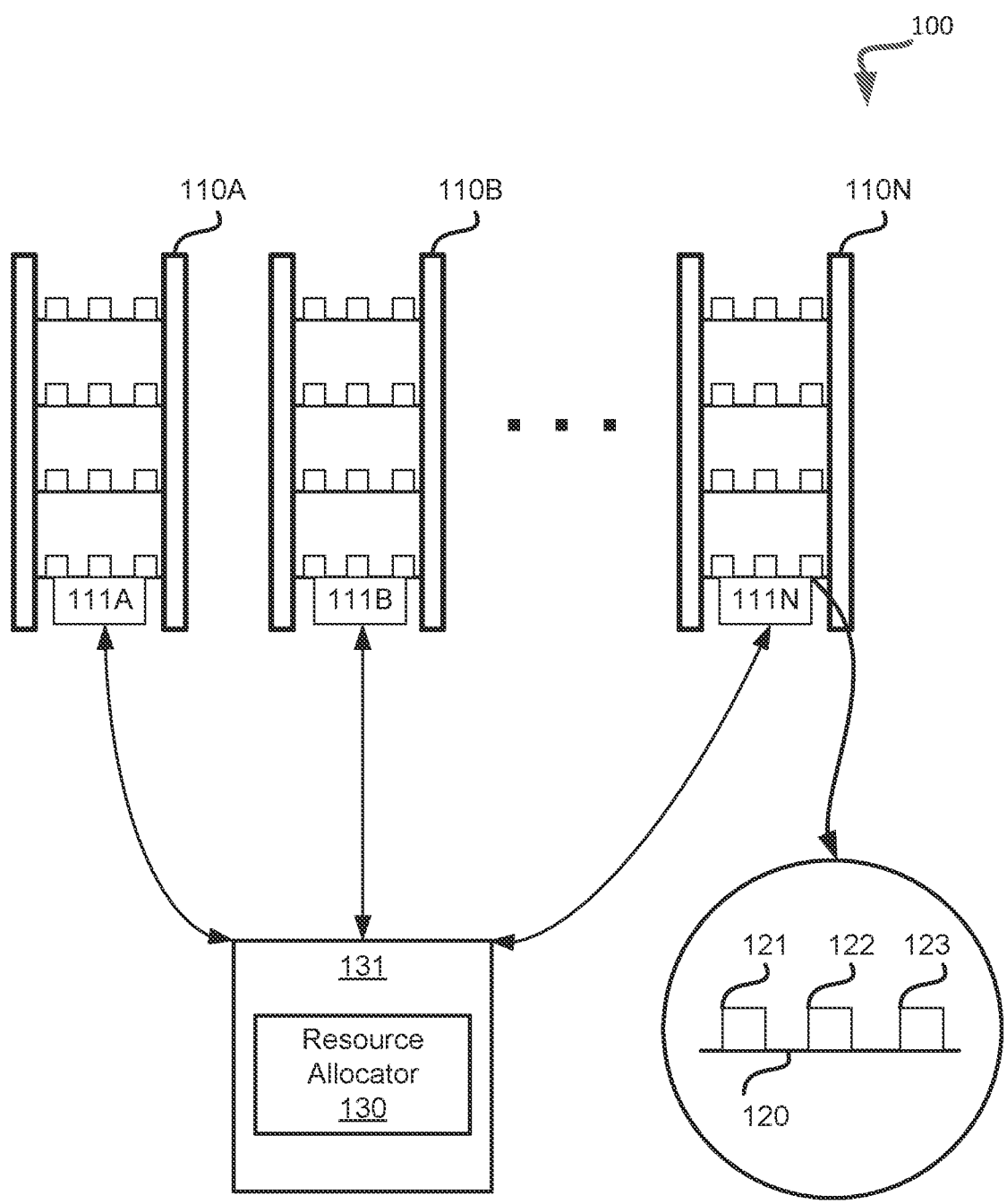
FIG. 1 illustrates an example environment to allocate test resources to perform a test of memory components in accordance with some embodiments of the present disclosure.

Aspects of the present disclosure are directed to the allocation of test resources to perform a test of memory components. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory components that are used in a memory sub-system can be tested before being utilized in the memory sub-system. In a conventional test process, the memory components can be placed into a chamber (i.e., an oven) that tests the memory components under various temperature conditions. For example, a single chamber can be used to test multiple memory components at a single time at a particular temperature. The test process can instruct various operations to be performed at the memory components at the particular temperature. Such operations can include, but are not limited to, read operations, write operations, and/or erase operations. The performance and behavior of the memory components can be observed while the test process is performed. For example, performance characteristics (e.g., read or write latencies) and reliability of data stored at the memory components can be measured and recorded during the test process. However, since the chamber can only apply a single temperature to the memory components at any particular time, the testing of the memory components at many different temperatures can require a large amount of time as the test process will need to be performed for each desired temperature. Additionally, the chamber can only perform a single test process at a time. As such, performing different tests of the memory components at different operating conditions (e.g., different temperatures) can utilize a large amount of time if many different conditions of the test process for the memory components are desired.

Aspects of the present disclosure address the above and other deficiencies by allocating test resources to perform a test of memory components. A distributed test platform can include multiple test resources. Each test resource can be a test socket that includes a memory component. A test socket can further include a temperature control component that is used to apply a particular temperature condition to the memory component that is included in the test socket. The test platform can further include multiple test boards that each includes one or more of the test sockets. The test boards can be organized into groups or racks and multiple racks can be at a particular location or site. As such, multiple sites can include racks of test boards that include multiple test sockets. The racks of the test platform can be coupled over a network to a resource allocator (e.g., a server or other such computing device) that is used to control or perform tests at the various test sockets of the test platform across the different test boards, test racks, and sites or locations.

The test resources of the test platform can be used to perform multiple different test processes at the same time on the test platform. For example, a first subset of the test sockets can be used to perform a first test while a second subset of the test sockets of the test platform can be used to concurrently perform a second test. As such, the resource allocator can allocate or assign the test sockets to be used in a new test of memory components. The new test can specify particular characteristics or types of memory components that are to be used in the test as well as a particular temperature that the temperature control components are to apply to memory components at the test sockets. Such characteristics can include, but are not limited to, types (e.g., design version) of memory components and usage characteristics of memory components. The resource allocator can then assign available test sockets of the test platform to the new test based on the characteristics specified by the new test as well as additional information of the test platform. For example, the available test sockets can further be assigned based on locations of the test sockets across various test racks or sites of the test platform and the temperature control components can be used to apply the temperatures specified by the test. Thus, the test platform can be a distributed set of test sockets across different locations or sites. Different groups of test sockets of the test platform can be assigned to different tests based on particular characteristics of test sockets specified by the different tests.

Advantages of the present disclosure include, but are not limited to, a decrease in the amount of time that the test platform is utilized to perform tests of the memory components. Furthermore, since many different tests can be performed at the test platform to test many different conditions (e.g., different temperatures) during the performance of many different sequences of operations, the testing of the memory components can be considered to be more robust as the reliability and performance of the memory components can be tested by performing many different and concurrent tests. As such, since many different tests of the memory components can be performed more quickly, the reliability of the memory components can also be increased as any potential defects or flaws can be identified and later addressed in the design or manufacturing of the memory components that are to be included in a memory sub-system.

FIG. 1 illustrates an example environment to allocate test resources to perform a test of memory components in accordance with some embodiments of the present disclosure. A test platform 100 can include one or more racks 110A, 110B, and 110N. Each of the racks 110A, 110B, and 110N can include multiple test boards 120 where each test board 120 includes one or more test sockets (i.e., test resources). The test platform 100 can include any number of racks or test sockets.

As shown, a test board 120 can include one or more test sockets. For example, a test board 120 can include a first test socket 121, a second test socket 122, and a third test socket 123. Although three test sockets are shown, a test board 120 can include any number of test sockets. Each test socket can include a memory component that has been embedded within the respective test socket. Additionally, each test socket can include a temperature control component that is used to apply a temperature condition to the embedded memory component. In some embodiments, the temperature control component can be a dual Peltier device (e.g., two Peltier devices) that utilize a Peltier effect to apply a heating or cooling effect at a surface of the dual Peltier device that is coupled to the embedded memory component. In the same or alternative embodiments, the temperature control component can be placed on top of the memory component in the respective test socket.

As shown, each test rack 110A, 110B, and 110N can include multiple test boards 120. Each of the test boards 120 of a particular test rack can be coupled with a local test component. For example, each test rack 110A, 110B, and 110N can respectively include a local test component 111A, 111B, and 111N. Each of the local test components 111A, 111B, and 111N can receive instructions to perform a test or a portion of a test that is to be performed at the test sockets of the respective test rack. For example, a resource allocator component 130 can receive (e.g., from a user) conditions of the test that is to be performed and the resource allocator component 130 can determine particular test sockets across the different test boards 120 at one or more of the test racks 110A, 110B, and 110N that can be used by the test. In some embodiments, the resource allocator component 130 can be provided by a server 131. In some embodiments, the server 131 is a computing device or system that is coupled with the local test components 111A, 111B, and 111N over a network.

The temperate control component of each test socket 121, 122, and 123 of each test board 120 can be used to apply a different temperature condition to the respective embedded memory component. Furthermore, each test socket 121, 122, and 123 can be used to perform different operations at the embedded memory component.

The resource allocator component 130 can receive a test input from a user. The test input can specify conditions of the test that is to be performed with one or more memory components. For example, the test can specify particular temperature conditions that are to be applied to memory components and a sequence of operations that are to be performed at memory components under particular temperature conditions. The resource allocator 130 can retrieve a data structure that identifies available test sockets across the test platform 100 as well as characteristics of the available test sockets. Subsequently, the resource allocator component 130 can assign test sockets at the test platform 100 that include embedded memory components that match or satisfy the conditions of the test. The resource allocator component 130 can then transmit instructions to local test components of test racks that include test sockets that are to be used in the test. Further details with respect to the resource allocator component 130 are described below.

Figure 2:
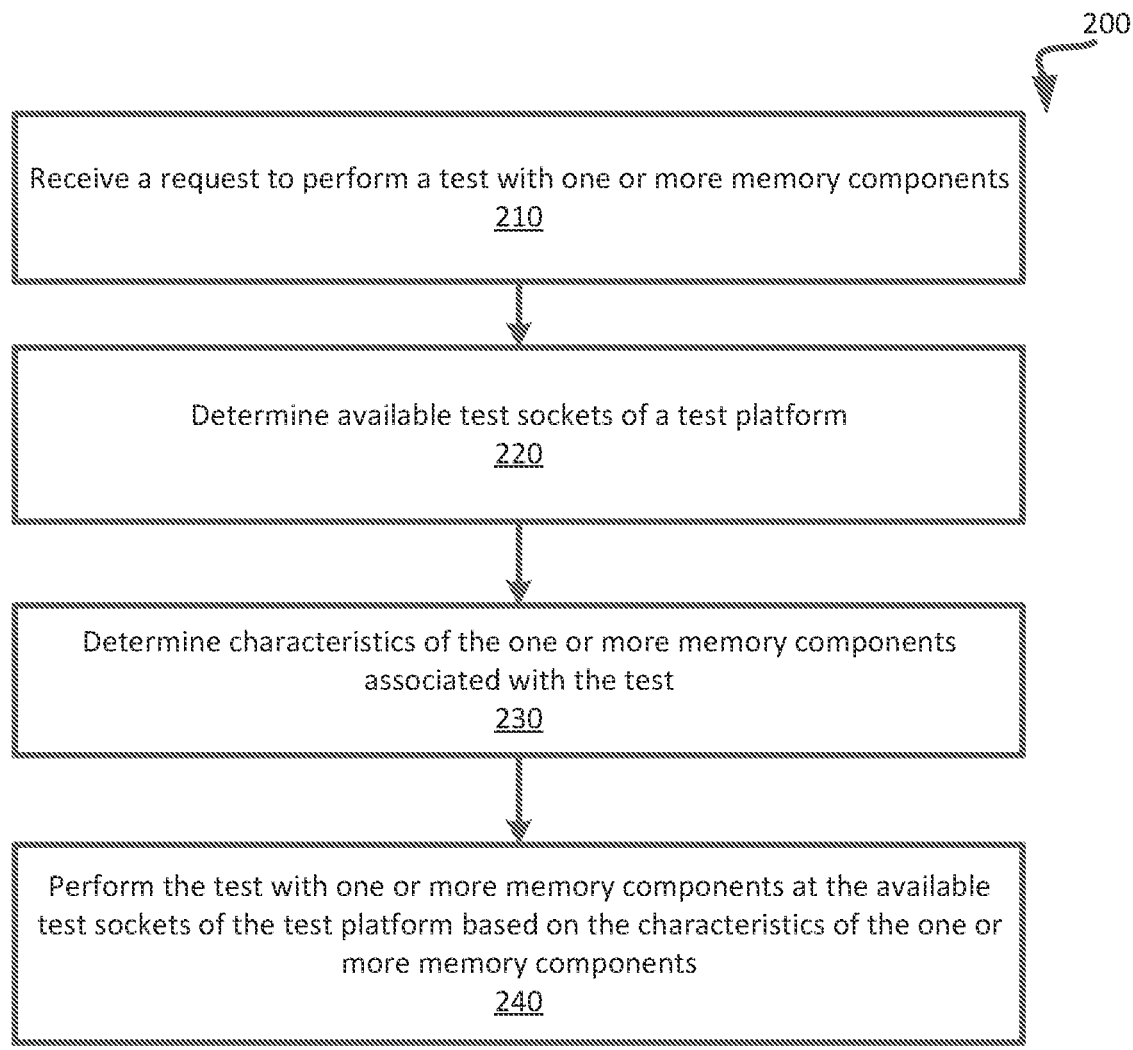
FIG. 2 is a flow diagram of an example method to allocate test resources to perform a test of memory components in accordance with some embodiments of the present disclosure.

FIG. 2 illustrates an example method 200 to allocate test resources to perform a test of memory components in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the resource allocator component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 210, the processing logic receives a request to perform a test with one or more memory components. For example, a user can provide a request to run a test of memory components by a test platform. The test can specify operations that are to be performed with the memory components. Such operations can include, but are not limited to, read operations, write operations, and erase operations. In some embodiments, the test specifies a sequence of multiple operations. The test can specify operating conditions at which the operations are to be performed at particular memory components. The operating conditions can be a temperature condition of the memory component when the operations are performed at the memory component. In some embodiments, the test can specify desired conditions that correspond to desired characteristics of the memory components that are to be used for the test. The desired characteristics of the memory components can include, but are not limited to, a number of operations that have been performed by the memory components. For example, the desired characteristics can specify memory components that have had more or less of a particular number of program-erase operations or cycles and a particular number of read operations. In some embodiments, the desired characteristics can include the prior temperature conditions that have been applied to the memory component. For example, the prior temperatures at which operations have been performed at the memory component for prior tests can be specified (i.e., a temperature profile of the memory component). In some embodiments, the test can specify particular types of memory components that are to be used for the test. For example, particular versions (i.e., designs or manufacturing revisions) of the memory components that are to be used in the test can be specified. As such, a user can provide information that specifies conditions at which a test of memory components is to be performed at a test platform.

At operation 220, the processing logic determines available test sockets of a test platform. For example, test sockets at test boards of the test platform that are not currently being used to perform another test or are not scheduled to be used to perform another test can be identified. For example, the test platform can include a number of test sockets and a subset of the test sockets can be currently used by another test of memory components while a second subset of the test sockets are not currently being used by another test of memory components. Thus, the second subset of the test sockets can be considered to be available test sockets. In some embodiments, the test can specify a period of time for which the test is to be completed. An available test socket in such a case can be a test socket that can be utilized for the test within the period of time. As such, if a particular test socket is currently being used by a test and will be scheduled to be free or available afterwards and the test can perform operations at the particular test socket within the specified period of time, then the particular test socket can be considered an available test socket. At operation 230, the processing logic determines characteristics of the one or more memory components associated with the test. For example, as previously mentioned, the test can specify conditions of the test that correspond to desired characteristics of the memory components that are to be used in the test. Thus, the desired characteristics of memory components that are to be used in a test can be provided by a request for the test. In some embodiments, the available test sockets can be test sockets that are not being used by another test and that match the desired characteristics for memory components that are specified by the test. Thus, a first subset of test sockets (i.e., test resources) of the test platform can be available test sockets that match the conditions specified by the test and a second subset of test sockets can be test sockets that are not available and/or do not match the conditions specified by the test. Further details with respect to matching the desired characteristics are described in conjunction with FIG. 3.

At operation 240, the processing logic performs the test with one or more memory components at the available test sockets based on the characteristics of the one or more memory components. For example, the test can be performed at test sockets that are not currently being used by another test and that have characteristics that match the desired characteristics specified by the test. The test can be performed at different test sockets that are included in different test racks across the test platform. The performance of the test can apply different temperature conditions at different test sockets while different or the same sequences of operations are being performed at the test sockets. For example, a first socket can run a sequence of operations at a first temperature and a second test socket can run the same sequence of operations at a different second temperature. In some embodiments, the first test socket can run a first sequence of operations at a temperature and the second test socket can run a different second sequence of operations at the same temperature. In the same or alternative embodiments, the temperature condition applied to a particular test socket can vary during the performance of the sequence of operations.

Figure 3:
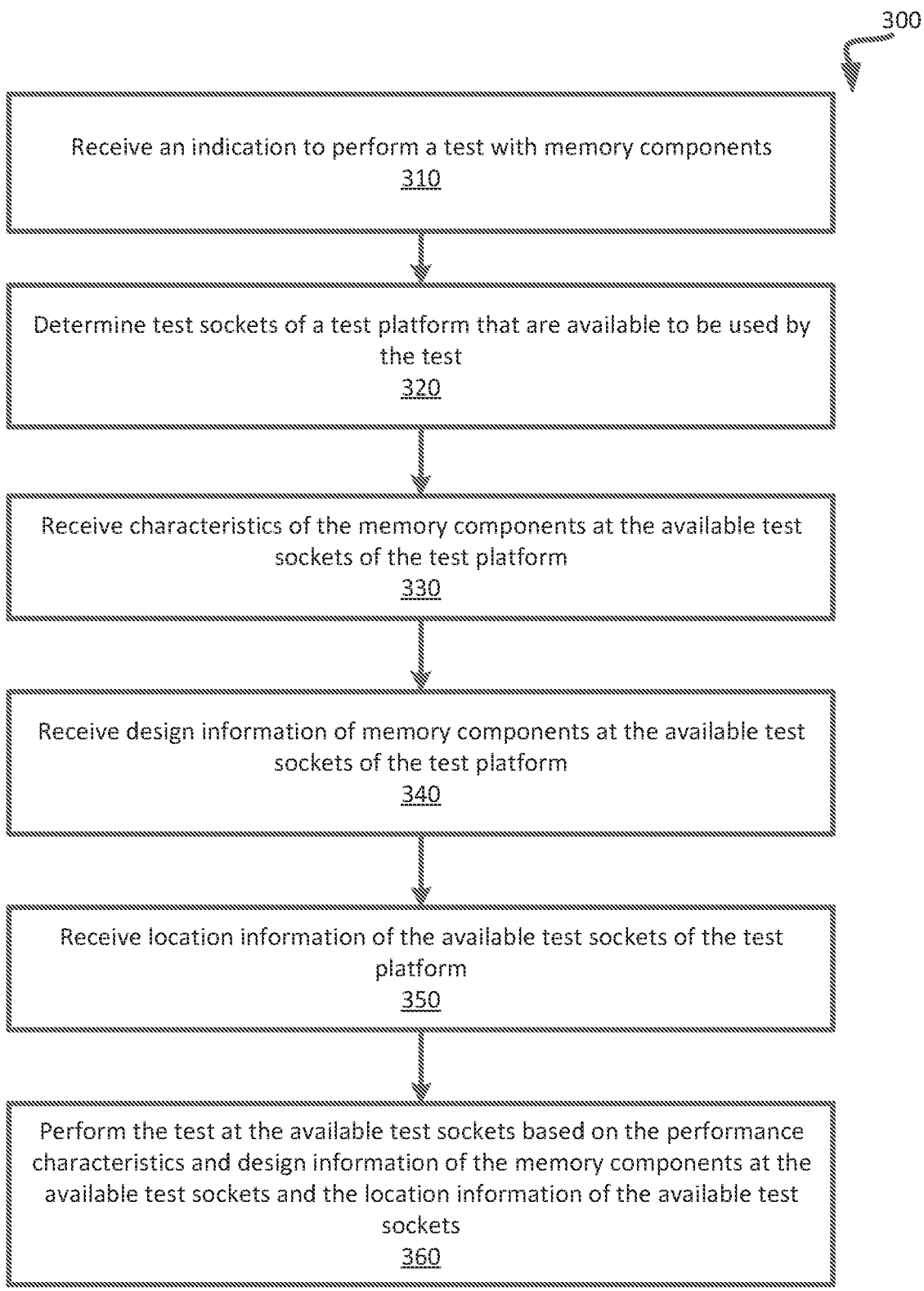
FIG. 3 is a flow diagram of an example method to allocate test resources based on characteristics of memory components and a requested test in accordance with some embodiments.

FIG. 3 is a flow diagram of an example method 300 to allocate test resources based on characteristics of memory components and a requested test in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the resource allocator component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 310, the processing logic receives an indication to perform a test with memory components. For example, a user can specify conditions of a test that is to be performed with memory components. The conditions can indicate desired characteristics of the memory components that are to be used in the test and a temperature condition that is to be applied to the utilized memory components. The test can further specify a sequence of operations that are to be performed at the memory components during the test. At operation 320, the processing logic determines test sockets of a test platform that are available to be used by the test. For example, test sockets that are not currently being used by the test or that can be used to complete the test within a time threshold specified by the user can be identified throughout the test platform.

At operation 330, the processing logic receives characteristics of memory components at the available test sockets of the test platform. The characteristics can be a performance profile for each of the memory components that are currently embedded within an available test socket. The performance profile can identify a number of operations that have been performed at the memory component. Thus, the performance profile can indicate a history of use of the memory component for prior tests that have been performed at the test platform with the test socket that includes the memory component. In some embodiments, the characteristics can be a temperature profile for each of the memory components that are currently embedded within an available test socket. For example, the temperature profile can indicate the prior temperatures that have been applied to the memory component during prior tests as well as when the prior temperatures were applied to the memory component during the prior tests. As such, the characteristics of the memory component can be based on the prior tests that have utilized a test socket or test resource that utilized the memory component.

Furthermore, at operation 340, the processing logic receives design information of memory components at the available test sockets of the test platform. The design information can specify design or manufacturing versions of each memory component. The design or manufacturing version can indicate a particular design of the memory component or a time when the memory component was fabricated or manufactured. Each different design of the memory component can result in a different structure of the memory component. In some embodiments, the design information can specify a setting (i.e., a trim) that has been defined for a memory component. The setting can be a value that can be updated or changed and that is used to control a functionality of the memory component. Thus, the design information can specify a design or manufacturing version of the memory component as a result of a process change or other such physical change to a memory component and/or a setting that has been defined for a memory component. At operation 350, the processing logic receives location information of the available test sockets of the test platform. The location information can specify a particular geographic location or site that includes the test rack at which each available test socket is located. The location information can further identify the particular test rack that includes the available test socket. Thus, the location information can be used to identify groups of test sockets that are at a single geographic location or site or groups of test sockets that are available at a single test rack.

The characteristic information, design information, and location information that is received can be stored at a data structure at a server that includes the resource allocator component. The data structure can be updated as tests are performed at the test platform. For example, the data structure can be updated to reflect new characteristics (e.g., new performance profiles or temperature profiles) of memory components that are changed as new tests are performed. The design information can be provided when a memory component is embedded within a test socket and the location information can be provided by an administrator to be stored at the data structure.

As shown, at operation 360, the processing logic can perform the test at the available test sockets based on the characteristics and design information of the memory components at the available test sockets and the location information of the available test sockets. For example, test sockets with memory components that have characteristics that match the desired characteristics of the test can be reserved or used for the test. Similarly, test sockets with memory components that have a design version that matches the desired design version can be reserved or used for the test. Furthermore, groups of test sockets can be used for the test based on the locations of the test sockets. Further details with respect to utilizing the locations of test sockets are described in conjunction with FIG. 4. The available test sockets that satisfy the conditions of the test (e.g., match with the desired characteristics or design information) and that satisfy location criteria can be used to perform the test.

Figure 4:
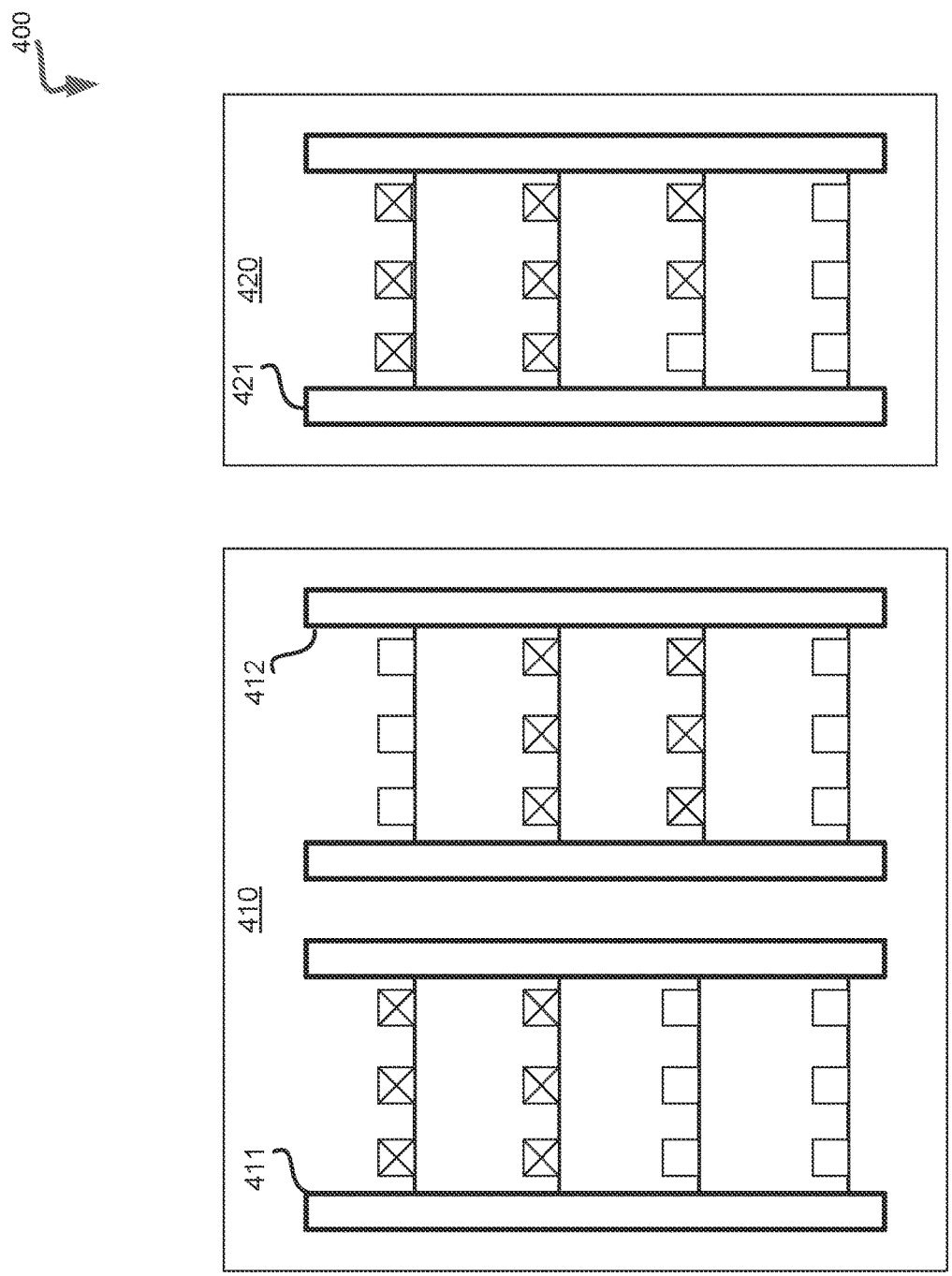
FIG. 4 illustrates the allocation of test resources in accordance with some embodiments of the present disclosure.

FIG. 4 illustrates the allocation of test resources in accordance with some embodiments of the present disclosure. The allocation of the test resources can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the allocation of the test resources is performed by the resource allocator component 130 of FIG. 1.

In some embodiments, the available test sockets that satisfy conditions of the test can be selected based on the location information of the available test sockets. The available test sockets can be selected based on a policy that specifies to select available test sockets at a single geographical location or site. For example, as shown, a first location 410 can include a first test rack 411 and a second test rack 412. A second location 420 can include a third test rack 421. Each of the locations 410 and 420 can be separate locations. For example, the test racks of the first location 410 can be part of a first network that is coupled with the server that includes the resource allocator component and the rest rack of the second location 420 can be part of a different second network that is coupled with the same server that includes the resource allocator component.

As shown in FIG. 4, a test socket with an 'X' represents a test socket that is not available for a requested test. For example, such a test socket can be currently used by another test. As previously described, the policy can specify to select available test sockets at a single geographical location or site. If the test is to use seven memory components at available test sockets, then seven test sockets at the first location 410 can be selected or reserved for the test instead of using or reserving any available test sockets at the second location 420. The utilization of test sockets at single site can result in the test being performed in less time as test data can be collected locally at the site and provided back to the resource allocator component. In some embodiments, the policy can specify to utilize more test racks at a single site. For example, the test sockets used in the test can be located in multiple test racks at a single site or location. For example, if a test specifies that six test sockets are to be utilized, three of the utilized test sockets can be located at the first test rack 411 and another three of the utilized test sockets can be located at the second test rack 412.

Figure 5:
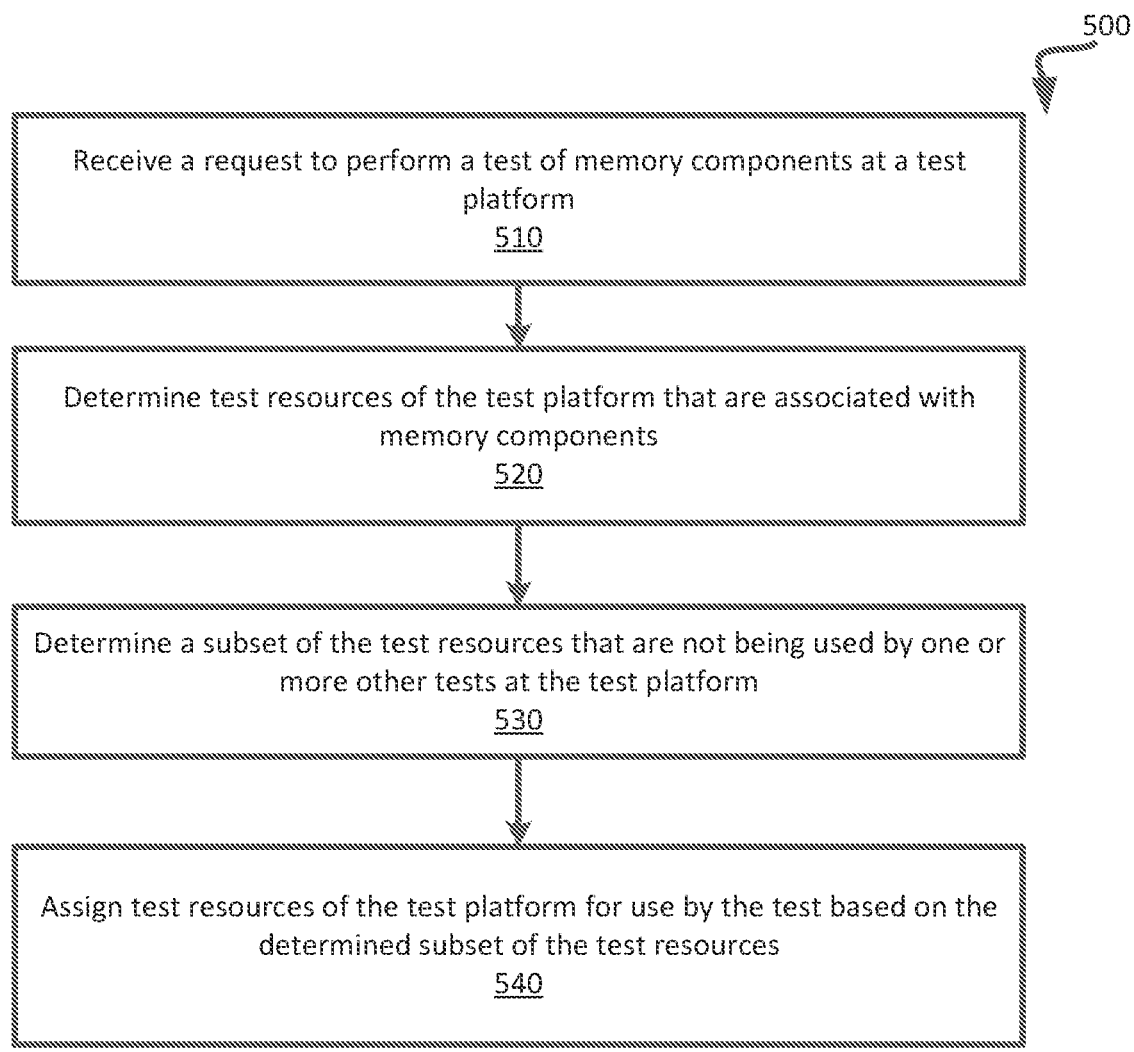
FIG. 5 is a flow diagram of an example method to allocate available test resources for a test of memory components in accordance with some embodiments.

FIG. 5 is a flow diagram of an example method 500 to allocate available test resources for a test of memory components in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the resource allocator component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 510, the processing logic receives a request to perform a test of memory components at a test platform. At operation 520, the processing logic determines test resources of the test platform that are associated with memory components. For example, each test resource (i.e., test socket) can include a separate memory component. A data structure can identify each test resource at the test platform. At operation 530, the processing logic determines a subset of the test resources that are not being used by one or more other tests at the platform. For example, the test platform can be performing multiple tests of memory components that each utilizes one or more test resources associated with memory components. The test resources that are not currently being used by any other test can be identified. Subsequently, at operation 540, the processing logic assigns test resources of the test platform for use by the test based on the determined subset of the test resources. For example, one or more test resources that are not currently being used by another test can be assigned to the test. In some embodiments, the one or more test resources that are not currently being used (e.g., available test resources or test sockets) can be selected to be used by the test as previously described.

In some embodiments, the request to perform the test can specify an amount of time that can elapse to complete the test. For example, the user can specify that the results of the test should be returned or completed within two days. The test resources of the test platform can then be assigned to the test based on the test resources being able to complete the test within the elapsed time. For example, the request to perform the test within two days can be received while a particular test resource is currently being used by another test. If the utilization of the particular test resource by the other test is completed before two days and if the requested test can be completed when using the particular test resource in the remaining amount of time (e.g., from two days), then the particular test resource can be reserved for the requested test after the other test has completed.

Figure 6:
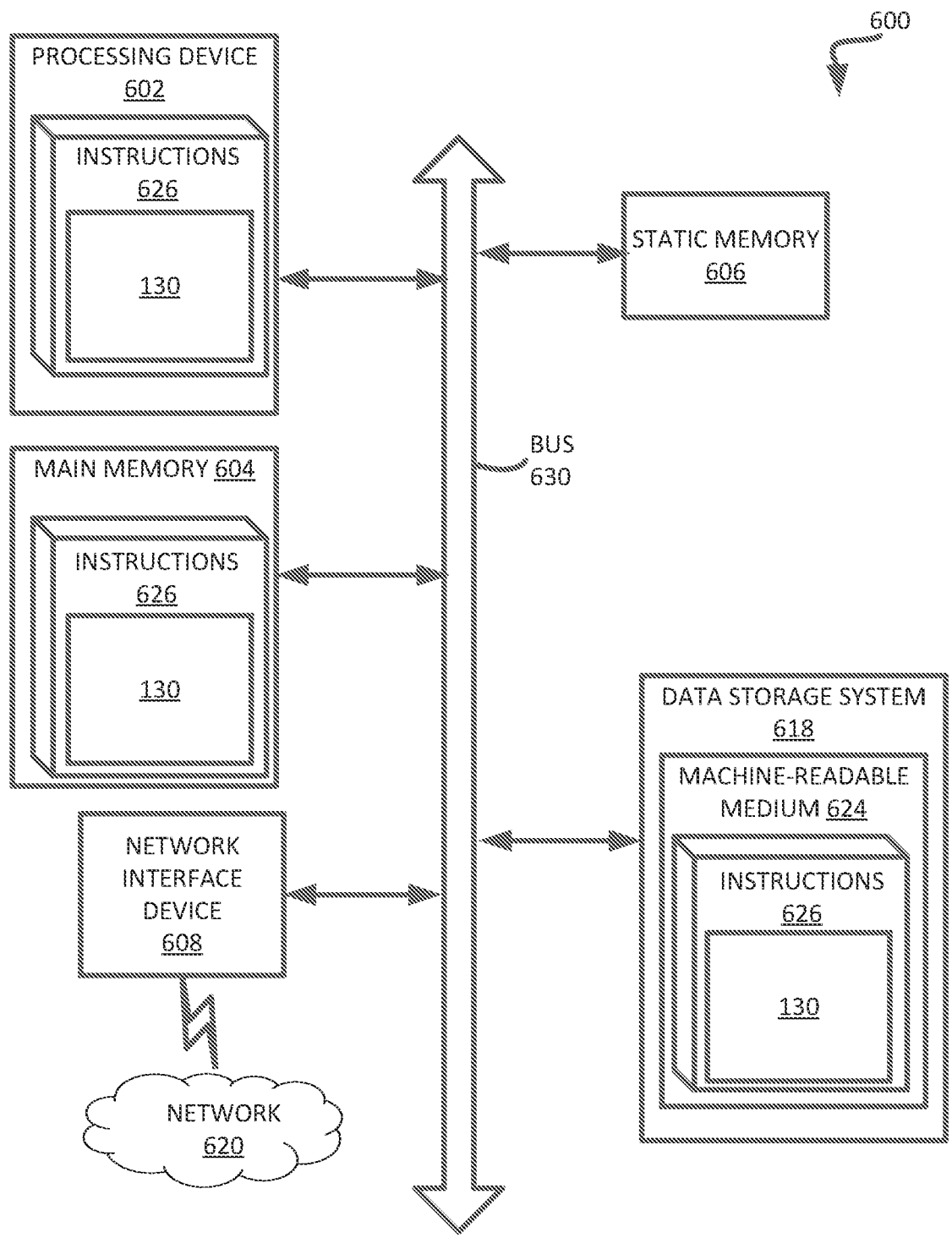
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host or server system that includes, is coupled to, or utilizes a test platform (e.g., to execute operations corresponding to the resource allocator component 130 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to a memory sub-system.

In one embodiment, the instructions 626 include instructions to implement functionality corresponding to a resource allocator component (e.g., the resource allocator component 130 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
receive a request to perform a first test of the memory component at a test platform;
identify a plurality of test sockets of the test platform;
identify, among the plurality of test sockets, a subset of test sockets not being used by a second test of the plurality of memory component at the test platform; and
assign a test socket, selected from the subset of test sockets, to obtain an assigned test socket for use by the first test.

2. The system of claim 1, wherein the memory component is comprised within a plurality of memory components, and wherein each test socket of the plurality of test sockets is coupled with a respective memory component of the plurality of memory components.

3. The system of claim 1, wherein the test socket is selected from the subset of test sockets based on a characteristic of the memory component matching a desired characteristic specified by the first test.

4. The system of claim 1, wherein the test socket comprises the memory component and a temperature control element.

5. The system of claim 1, wherein the processing device is further to:
determine a desired characteristic of the memory component, wherein assigning the test socket is performed based on the desired characteristic of the memory component.

6. The system of claim 5, wherein the desired characteristic of the memory component comprises an indication of one or more prior operations that have been performed with respect to the memory component and an indication of a prior temperature condition that has been applied to the memory component.

7. The system of claim 1, wherein the processing device is further to:
determine a location of each test socket of the subset of test sockets, wherein assigning the test socket is further performed based on the location of each test socket.

8. A method comprising:
receiving, by a processing device, a request to perform a first test of a memory component at a test platform;
identifying, by the processing device, a plurality of test sockets of the test platform;
identifying, by the processing device among the plurality of test sockets, a subset of test sockets not being used by a second test of the memory component at the test platform; and
assigning, by the processing device, a test socket, selected from the subset of the test sockets, to obtain an assigned test socket for use by the first test.

9. The method of claim 8, wherein the memory component is comprised within a plurality of memory components, and wherein each test socket of the plurality of test sockets is coupled with a respective memory component of the plurality of memory components.

10. The method of claim 8, wherein the test socket is selected from the subset of test sockets based on a characteristic of the memory component matching a desired characteristic specified by the first test.

11. The method of claim 8, wherein the test socket comprises the memory component and a temperature control element.

12. The method of claim 8, further comprising:
determining, by the processing device, a desired characteristic of the memory component, wherein assigning the test socket is performed based on the desired characteristic of the memory component.

13. The method of claim 12, wherein the desired characteristic of the memory component comprises an indication of one or more prior operations that have been performed with respect to the memory component and an indication of a prior temperature condition that has been applied to the memory component.

14. The method of claim 8, further comprising:
determining, by the processing device, a location of each test socket of the subset of test sockets, wherein assigning the test socket is further performed based on the location of each test socket.

15. A non-transitory computer readable medium comprising instructions, which when executed by a processing device, cause the processing device to perform operations comprising:

receiving a request to perform a first test of a memory component at a test platform;

identifying a plurality of test sockets of the test platform;

identifying, among the plurality of test sockets, a subset of test sockets not being used by a second test of the memory component at the test platform; and assigning a test socket, selected from the subset of test sockets, to obtain an assigned test socket for use by the first test.

16. The non-transitory computer readable medium of claim 15, wherein the memory component is comprised within a plurality of memory components, and wherein each test socket of the plurality of test sockets is coupled with a respective memory component of the plurality of memory components, and wherein the test socket is selected from the subset of test sockets based on a characteristic of the memory component matching a desired characteristic specified by the first test.

17. The non-transitory computer readable medium of claim 15, wherein the test socket comprises the memory component and a temperature control element.

18. The non-transitory computer readable medium of claim 15, wherein the operations further comprise:

determining a desired characteristic of the memory component, wherein assigning the test socket is performed based on the desired characteristic of the memory component.

19. The non-transitory computer readable medium of claim 18, wherein the desired characteristic of the memory component comprises an indication of one or more prior operations that have been performed with respect to the memory component and an indication of a prior temperature condition that has been applied to the memory component.

20. The non-transitory computer readable medium of claim 15, wherein the operations further comprise:

determining a location of each test socket of the subset of test sockets, wherein assigning the test socket is further performed based on the location of each test socket.

\* \* \* \* \*